(12) United States Patent
Kirchhoff

(10) Patent No.: US 6,562,734 B2
(45) Date of Patent: May 13, 2003

(54) METHOD OF FILLING GAPS ON A SEMICONDUCTOR WAFER

(75) Inventor: Markus Kirchhoff, Ottendorf-Okrilla (DE)

(73) Assignee: Semiconductor 300 GmbH & Co. KG, Dresden (DE)

(*) Notice: Subject to any disclaimer, the term of this patent is extended or adjusted under 35 U.S.C. 154(b) by 0 days.

(21) Appl. No.: 09/954,414

(22) Filed: Sep. 17, 2001

(65) Prior Publication Data

US 2002/0042186 A1 Apr. 11, 2002

Related U.S. Application Data

(63) Continuation of application No. PCT/EP00/01763, filed on Mar. 1, 2000.

(30) Foreign Application Priority Data

Mar. 17, 1999 (EP) .............................................. 99105494

(51) Int. Cl.$^7$ .............................................. H01L 21/469
(52) U.S. Cl. ..................... 438/788; 438/789; 438/792; 438/424
(58) Field of Search ............................... 438/788, 789, 438/792, 424

(56) References Cited

U.S. PATENT DOCUMENTS

| | | | |
|---|---|---|---|
| 5,204,138 A | 4/1993 | Nguyen et al. | 427/578 |
| 5,356,722 A | 10/1994 | Nguyen et al. | 427/569 |
| 5,643,640 A | 7/1997 | Chakravarti et al. | 427/578 |
| 5,741,740 A | 4/1998 | Jang et al. | 438/435 |
| 6,004,873 A | * 12/1999 | Jang et al. | 438/618 |
| 6,153,261 A | * 11/2000 | Xia et al. | 427/255.29 |
| 6,184,158 B1 | * 2/2001 | Shufflebotham et al. | 204/192.23 |

FOREIGN PATENT DOCUMENTS

| | | | |
|---|---|---|---|
| EP | 759481 A1 | * | 2/1997 |
| EP | 798776 A2 | * | 10/1997 |
| EP | 843347 A2 | * | 5/1998 |
| WO | WO 97/24761 | | 7/1997 |

OTHER PUBLICATIONS

Arthur Sherman: "Chemical vapor deposition for microelectronics", Noyes Publications: Park Ridge, N. J., 1987, p. 53.

* cited by examiner

Primary Examiner—Trung Dang
(74) Attorney, Agent, or Firm—Laurence A. Greenberg; Werner H. Stemer; Ralph E. Locher

(57) ABSTRACT

A method of filling gaps on a semiconductor wafer with a dielectric material employs a plasma enhanced chemical vapor deposition (PECVD) process with a temperature in the range of 500 to 700° C. As a result of the deposition process, gaps resulting from e.g. shallow trench isolation or premetal dielectric techniques are filled homogeneously without any voids. The deposition may be improved by applying two radio frequency signals with different frequencies.

7 Claims, 2 Drawing Sheets

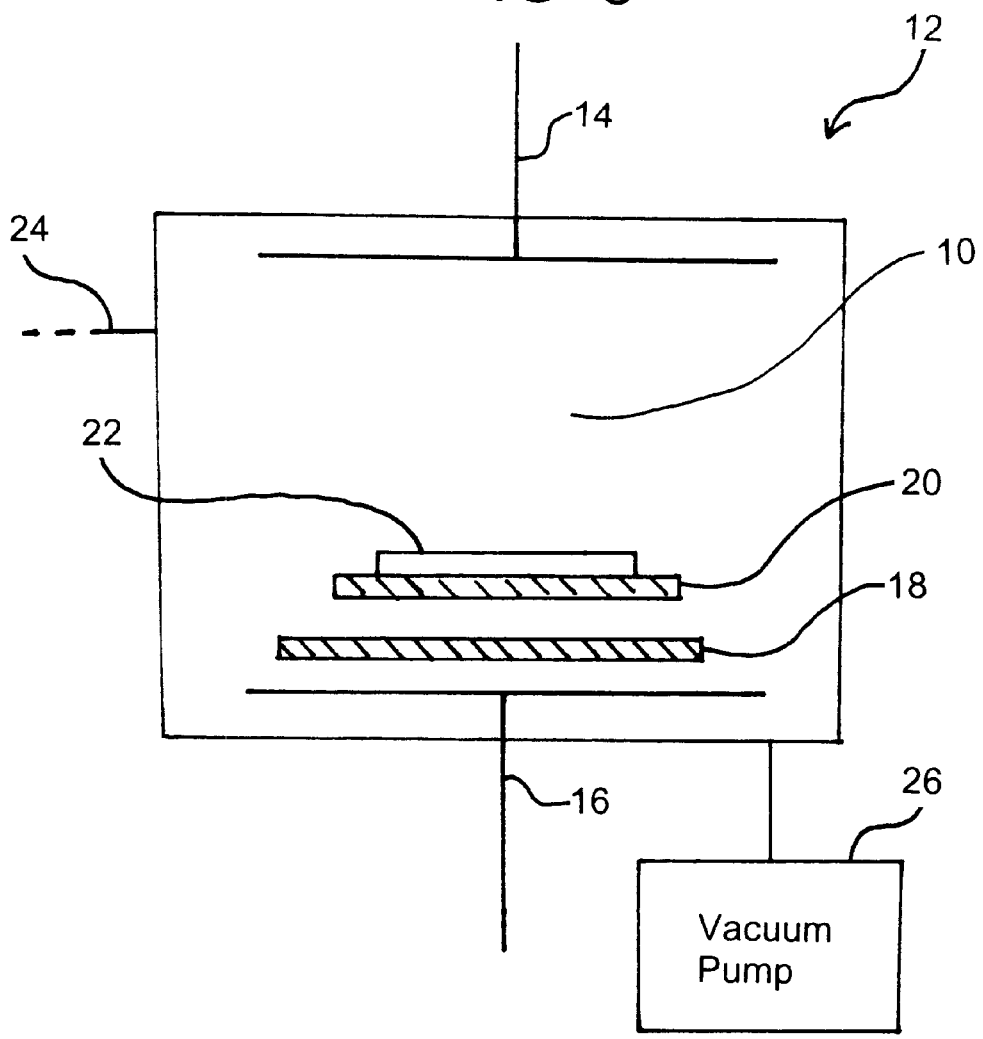

METHOD OF FILLING GAPS ON A SEMICONDUCTOR WAFER

CROSS-REFERENCE TO RELATED APPLICATION

This application is a continuation of copending International Application No. PCT/EP00/01763, filed Mar. 1, 2000, which designated the United States.

BACKGROUND OF THE INVENTION

FIELD OF THE INVENTION

The invention relates to a method of filling gaps on a semiconductor wafer with a dielectric material using a CVD (chemical vapor deposition) processing apparatus for performing a CVD-process under plasma and vacuum conditions at elevated temperatures.

When manufacturing integrated semiconductor circuits, certain process technologies require the filling of gaps on the surface of the semiconductor wafer. The wafer incorporates a plurality of integrated circuit elements after certain processing steps are executed. The requirement to fill gaps applies especially when manufacturing integrated circuit elements on semiconductor wafers that have been produced in accordance with sub 0.25 micron layout rules. The gaps may be located between transistors for isolation purposes according to the shallow trench isolation technique (STI) or may be located between polysilicon signal wires that precede the metalization process steps (premetal dielectric, PMD). The dielectric material to fill the gaps may be any known dielectric material as for example $SiO_2$, BPSG, PSG, BSG, SiN, etc.

In known processes for the manufacturing of ICs rather complex or ineffective CVD-deposition processes for filling gaps were used. For example a High Density Plasma-(HDP)-CVD-reactor based on a silane/argon gas mixture at around 350 to 400° C. is used employing simultaneous oxide deposition and sputtering. Also, a HDP-CVD-process based on a silane-helium mixture at 600° C. is used for gap filling. However, helium is a very light ion and its sputter efficiency is almost zero. This leads to a bottom up fill of the gap.

Another process uses post deposition reflow, e.g. deposition of a glass on basis of boron phosphorous silane (BPSG) or tetra ethyl ortho silicate (TEOS) and a subsequent annealing at 850° C. Further, another process uses in situ reflow above the glass transition temperature which is greater than 750° C., e.g. in a Low Pressure-(LP)-CVD-reactor; the glass itself flows. Below the glass transition temperature at about 400 to 600° C. a Sub Atmospheric Pressure-(SA)-CVD-reactor is used. A SACVD reactor commonly operates at pressures in the range from $2.66 \times 10^3$ Pa to $8.0 \times 10^4$ Pa (20 to 600 Torr).

HDP-CVD-reactors operate at a very low pressure, typically in the range of 0.133 Pa to 3.33 Pa (1 to 25 mTorr). The reaction chamber is rather expensive. SACVD-reactors use aggressive ozone molecules. The turnaround time for wafers is rather low so that a number of SACVD-reactors have to be operated in parallel. Thus, HDP-CVD-based processes or SACVD-based processes are quite expensive.

U.S. Pat. No. 5,643,640 discloses a fluorine doped phosphosilicate glass process (FPSG) using a Plasma Enhanced-(PE)-CVD-deposition for filling gaps or voids. The gaps may have a high aspect ratio. The process is carried out at a temperature between 400 to 500° C. Using fluorine, however, has the drawback that the gate oxide may be contaminated, damaged or the fluorine may further be oxidized. Fluorine doped deposition materials are not desired in the lower front end of line levels of subquarter micron process technology.

U.S. Pat. No. 5,204,138 discloses a plasma enhanced CVD process for fluorinated silicon nitride films. The process runs at about 267 Pa to $1.33 \times 10^3$ Pa (2 to 10 Torr) at a temperature between 300° to 600° C. The fluorinated nitride film shows a high conformality over silicon trench structures.

International Publication No. WO 97/24761 discloses a void-free trench-fill process, which fills a trench in a two-step approach. The first step involves the deposition of a protection layer of silicon dioxide over the wafer into the trench. The second step involves forming a trench-fill layer of silicon dioxide over the protection layer. The two steps employ different RF bias levels to the wafer. During trench-fill the temperature of the wafer is kept in a range of about 200° to about 700° C.

In U.S. Pat. No. 5,356,722 the RF power for a PECVD TEOS deposition can be employed at a frequency of 13.56 MHz or at lower frequencies in the range between 100 to 450 kHz.

SUMMARY OF THE INVENTION

It is accordingly an object of the invention to provide a method of filling gaps on a semiconductor wafer which overcomes the above-mentioned disadvantages of the heretofore-known methods of this general type and which provides a good void-free filling of a gap with a dielectric material at moderate costs.

With the foregoing and other objects in view there is provided, in accordance with the invention, a method of filling gaps on a semiconductor wafer with a dielectric material, the method including the steps of:

inserting a semiconductor wafer into a reaction chamber of a plasma enhanced chemical vapor deposition processing apparatus;

providing a reaction gas including nitrogen and being free of an element selected from the group consisting of a halogen component and ozone;

performing a chemical vapor deposition (CVD) under plasma conditions and under vacuum conditions to deposit a dielectric material on the semiconductor wafer by using the reaction gas;

performing the chemical vapor deposition at a temperature above 500° C.; and providing a reaction gas pressure between 13.3 Pa and $1.33 \times 10^3$ Pa (100 mTorr to 10 Torr) in the reaction chamber of the plasma enhanced chemical vapor deposition processing apparatus.

In other words, the method of the invention uses a plasma enhanced-(PE)-CVD-deposition apparatus at an elevated temperature above 500° C. Particularly the temperature is in the range of 500 to 700° C. In such a PECVD-process there is no need for using halogen ions or radicals. The PECVD-deposition process according to the invention is applicable to any common dielectric material, e.g. $SiO_2$, BPSG, PSG, BSG, SiN, and provides a conformal filling of the gap. A PECVD-reaction chamber operates at reasonable temperatures and vacuum pressures so that the costs of the reactor are below that of a HDP-CVD-apparatus. The throughput of a PECVD-reactor is higher than for a SACVD-reactor. Practically, a PECVD-chamber according to the invention will cost approximately half of a HDP-CVD-chamber and will have approximately double the throughput of a SACVD-chamber.

The reaction temperature, which lies preferably between 500 and 700° C. is caused by a ceramic heating element located under the receptor carrying the semiconductor wafer. The vacuum is generated by a vacuum pump. The pressure is between 13.3 Pa and $1.33 \times 10^3$ Pa (100 mTorr and 10 Torr).

The plasma gas in the chamber is generated by a radio frequency signal. The signal has a frequency of more than 10 MHz, preferably 13.5 MHz. The radio frequency signal is coupled into the chamber opposite the front side of the wafer. According to a preferred embodiment of the invention a second radio frequency signal is coupled into the chamber, too. The second radio frequency signal has a frequency of less than 100 kHz, preferably about 10 kHz. This means that the two frequencies of the radio frequency signals differ by at least two orders of magnitude. The first radio frequency signal has a power of several hundreds of Watts. The second radio frequency signal is applied with lower power. Both signals are applied through different coupling devices into the chamber or through the same coupling devices.

The reaction gas composition in the chamber may be of any known type. Due to the high temperature an addition of halogen components or radical components as is ozone will not be necessary. The reaction gas or precursor gas composition includes one of the following compositions:
Dielectric Material to be Deposited—Precursor $SiO_2$—TEOS, $O_2$, $N_2$ or $SiH_4$, $N_2O$, $N_2$ SiN—$SiH_4$, $N_2O$, $NH_3$, $N_2$ BSG—TEOS, TEB, $O_2$, $N_2$ or $SiH_4$, $B_2H_6$, $N_2O$, $N_2$ PSG—TEOS, TEPO, $O_2$, $N_2$ or $SiH_4$, $PH_3$, $N_2O$, $N_2$ BPSG—TEOS, TEB, TEPO, $O_2$, $N_2$ or $SiH_4$, $PH_3$, $B_2H_6$, $N_2O$, $N_2$ BSG/PSG/BPSG: Boro-/phosphorsilicate-/borophosphorsilicate-glass TEB: Tri ethyl borate TEPO: Tri ethyl phosphate The semiconductor wafers to be processed by the method according to the invention have gaps on the surface of the semiconductor wafer to be filled. The gaps may be shallow trenches that had been etched into the silicon substrate, e.g. by any dry etching technique. The trenches serve to separate and isolate transistors of the same type from each other. This layout structure is commonly called shallow trench isolation (STI).

Another area of application of the invention is to fill the gaps established by the polysilicon wiring structure. A multilayer structure composed of polysilicon, tungsten silicide and nitride is deposited on top of the wafer during the respective process steps. After patterning in order to generate local connections such as gate electrode connections and trench capacitor connections for DRAMs (dynamic random access memories), gaps are left between the multilevel polysilicon wiring structure. The gaps are to be filled with dielectric material according to the PECVD-process of the invention. The gaps in the polysilicon structure have high aspect ratios of up to 17. On the filled planar polysilicon-dielectric surface there is further deposited a metal layer for wiring. The above mentioned dielectric, therefore, is known as pre-metal dielectric (PMD).

Thus according to a preferred mode of the invention, gaps formed between transistors on the semiconductor wafer are filled with the dielectric material and according to another mode of the invention gaps formed between portions of a metalization layer on top of the semiconductor wafer are filled with the dielectric material.

Under the conditions of the PECVD-deposition process according to the invention, the reactive molecules have a high enough mobility due to the elevated temperature so that they reach the bottom of the gap to be deposited there. The corner effect, i.e. the phenomenon that molecules are primarily deposited at the upper edge of the gap, is reduced by the higher mobility of the molecules due to the elevated temperature. The second radio frequency coupled into the reaction chamber causes a sputter effect at the upper edge of the gap, i.e. molecules tending to be deposited at that location are loosened again by the application of the second radio frequency signal.

Other features which are considered as characteristic for the invention are set forth in the appended claims.

Although the invention is illustrated and described herein as embodied in a method of filling gaps on a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic diagram of a reaction chamber of a plasma enhanced chemical vapor deposition processing apparatus.

DESCRIPTION OF THE PREFERRED EMBODIMENTS

Figure 1:
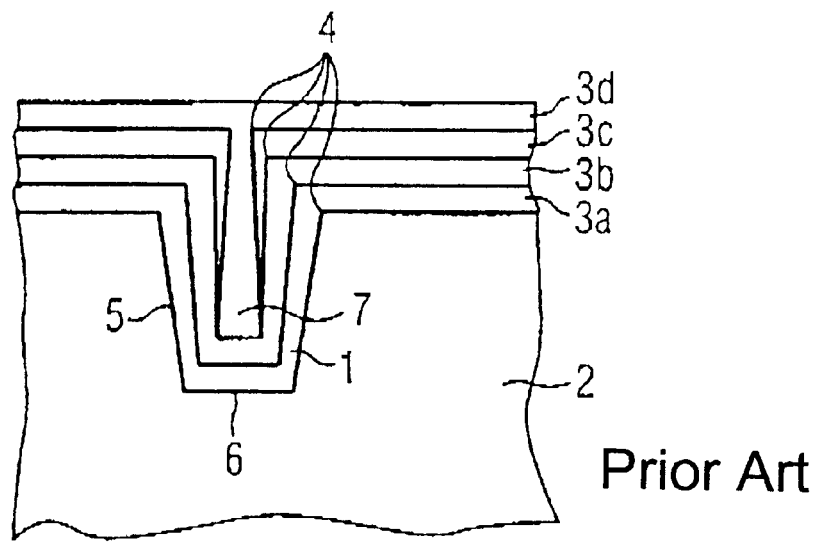
FIG. 1 is a diagrammatic partial sectional view of a semiconductor wafer with a gap filled according to a conventional method.
Figure 2:
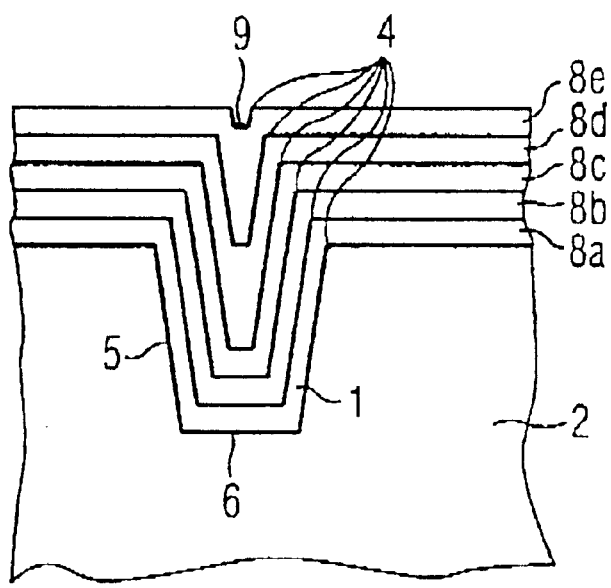
FIG. 2 is a diagrammatic partial sectional view of a semiconductor wafer with a gap filled according to the method of the invention.

Referring now to the figures of the drawings in detail and first, particularly, to FIGS. 1 and 2 thereof, in which corresponding elements are marked by the same reference symbols. The gap 1 to be filled is a gap between two CMOS (complementary metal-oxide semiconductor) transistors of the same type that are located on the top surface of a semiconductor wafer 2. In order to prevent a coupling between the transistors, the substrate between the transistors is cut or separated by a trench 1. This technique is called shallow trench isolation (STI). FIG. 1 shows the application of a PECVD-deposition process performed at approximately 400° C. The gap fill material in both examples is composed of, for example, silicon dioxide ($SiO_2$). During the course of the deposition process the dioxide grows on the wafer surface. This is illustrated by consecutive layers 3a, 3b, 3c, 3d showing the resulting thickness of deposited material at subsequent time instants. It is to be noted that under the normal PECVD-reaction parameters the deposition rate at the upper edge 4 of gap 1 is higher than at the side walls 5 or at the bottom 6 of gap 1. As a result, the $SiO_2$ grows faster at the upper edge 4 of the gap 1 than at the bottom 6. As a consequence, the gap is closed at the upper surface prior to a full and homogeneous filling of the gap. A void 7 is left in the center of the gap.

The PECVD-deposition process according to the invention provides a homogeneous filling of gaps without any voids even for gaps with a high aspect ratio. According to FIG. 2 the semiconductor wafer is inserted into the reaction chamber of a PECVD-deposition apparatus onto a receptor accommodating the wafer. The chamber is evacuated by a vacuum pump down to a pressure between 13.3 Pa and $1.33 \times 10^3$ Pa (100 mTorr and 10 Torr) during the deposition process. The chamber contains a reaction gas composition composed of TEOS, $O_2$, $N_2$ or $SiH_4$, $N_2O$, $N_2$ for $SiO_2$ deposition. The chamber is heated up to a temperature of more than 500° C., e.g. 600° C. Heating is performed by a ceramic heating element under the receptor. A RF-signal of e.g. 13.56 MHz is coupled into the chamber to generate a plasma. Preferably, a second RF-signal with 100 kHz is also coupled into the chamber. The power for the first RF signal and for the second RF signal is 100 to 1000 Watt, respectively, for 200 millimeter single wafer reactors. During the course of the deposition process the molecules deposit evenly on the surface of the wafer. The growth rate of the $SiO_2$ layer is approximately the same for all locations of the deposition. The growth rate at the upper edge 4 of the gap 1, the side walls 5, and the bottom 6 is roughly of the same magnitude. That is why the corner rounding effect at the upper edge 4 disappeared. Due to their high mobility, the reaction gas molecules reach or spread into the gap and equally deposit on its bottom and its side walls at approximately the same rate. Thus, the gap is filled homogeneously with $SiO_2$ without any voids. In FIG. 2 the layers 8a, 8b, 8c, 8d, 8e showing the deposited $SiO_2$ at consecutive times have no corner effect. However, at the end of the deposition a small notch centered over the gap 1 remains. The notch will be planarized during a subsequent step of polishing. The notch does not significantly influence the planarity of the surface of the wafer and can be neglected for further processing.

The application of the second RF-signal improves the gap fill behavior. The second RF-signal provides a sputter effect so that material being deposited at the corner region 4 is immediately sputtered off again.

FIG. 3 is a schematic diagram of a reaction chamber 10 of a plasma enhanced chemical vapor deposition processing apparatus 12. A radio frequency signal is coupled into the reaction chamber 10 by using for example electrodes 14, 16. A heating element 18 is located under a receptor 20 carrying the semiconductor wafer 22. The reaction gas may be provided through an inlet 24. A vacuum pump 26 is connected to the reaction chamber 10.

In conclusion, the invention provides a specific PECVD-deposition process to fill gaps on the surface of a semiconductor wafer with a dielectric material in a homogeneous void-free manner. Due to the nature of PECVD the process equipment is relatively cheap compared to prior gap filling techniques and has a high throughput rate.

I claim:

1. A method of filling gaps on a semiconductor wafer with a dielectric material, the method which comprises:
    inserting a semiconductor wafer into a reaction chamber of a plasma enhanced chemical vapor deposition processing apparatus;
    providing a reaction gas including nitrogen and being free of an element selected from the group consisting of a halogen component and ozone;
    performing a chemical vapor deposition under plasma conditions and under vacuum conditions to deposit a dielectric material on the semiconductor wafer by using the reaction gas;
    performing the chemical vapor deposition at a temperature above 500° C.; and
    providing a reaction gas pressure between 13.3 Pa and $1.33 \times 10^3$ Pa in the reaction chamber of the plasma enhanced chemical vapor deposition processing apparatus.

2. The method according to claim 1, which comprises performing the chemical vapor deposition at a temperature between 500° C. and 700° C.

3. The method according to claim 1, which comprises:
    coupling a first radio frequency signal having a first frequency and a second radio frequency signal having a second frequency into the reaction chamber, the second frequency being at least two orders of magnitude lower than the first frequency; and
    generating a plasma by coupling the first and second radio frequency signals into the reaction chamber.

4. The method according to claim 3, which comprises selecting the first frequency to be higher than 10 Megahertz and the second frequency to be lower than 100 Kilohertz.

5. The method according to claim 1, which comprises filling the reaction chamber with a reation gas composition including at least one gas selected from the group consisting of TEOS, $SiH_4$, TEB, $B_2H_6$, TEPO, $PH_3$, $O_2$, $N_2O$, $NH_3$, and $N_2$ during the step of performing the chemical vapor deposition.

6. The method according to claim 1, which comprises filling gaps formed between transistors on the semiconductor wafer with the dielectric material.

7. The method according to claim 1, which comprises filling gaps formed between portions of a metalization layer on top of the semiconductor wafer with the dielectric material.

* * * * *